United States Patent
Chowdhury et al.

(10) Patent No.: US 8,056,025 B1
(45) Date of Patent: Nov. 8, 2011

(54) INTEGRATION OF OPEN SPACE/DUMMY METAL AT CAD FOR PHYSICAL DEBUG OF NEW SILICON

(75) Inventors: Vijay Chowdhury, Fremont, CA (US); Che Ta Hsu, San Jose, CA (US); Ada Yu, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 756 days.

(21) Appl. No.: 12/035,403

(22) Filed: Feb. 21, 2008

(51) Int. Cl.
*G06F 17/50* (2006.01)
*G06F 19/00* (2011.01)
*G01R 31/28* (2006.01)

(52) U.S. Cl. ........... 716/54; 716/111; 716/136; 714/27; 714/30; 714/733; 714/734; 324/755.01; 324/538

(58) Field of Classification Search ............... 716/4, 54, 716/111, 136; 714/27, 30, 733, 734; 324/755, 324/763, 765, 538, 755.01; 700/98, 121
See application file for complete search history.

(56) References Cited

U.S. PATENT DOCUMENTS

| | | | |
|---|---|---|---|
| 5,498,767 A * | 3/1996 | Huddleston et al. | 716/122 |
| 5,552,333 A * | 9/1996 | Cheung et al. | 438/129 |
| 5,594,273 A * | 1/1997 | Dasse et al. | 257/620 |
| 6,068,892 A * | 5/2000 | Ma | 428/14 |
| 7,263,679 B2 * | 8/2007 | Kuge et al. | 716/114 |
| 2003/0084418 A1 * | 5/2003 | Regan | 716/14 |
| 2004/0172605 A1 * | 9/2004 | Kuge et al. | 716/1 |
| 2005/0208684 A1 * | 9/2005 | Yamada et al. | 438/14 |
| 2005/0231222 A1 * | 10/2005 | DiOrio et al. | 324/754 |
| 2006/0038172 A1 * | 2/2006 | Akram | 257/48 |
| 2006/0109022 A1 * | 5/2006 | Yoshida et al. | 324/765 |
| 2006/0190891 A1 * | 8/2006 | Ku et al. | 716/10 |
| 2007/0204243 A1 * | 8/2007 | Ito et al. | 716/4 |
| 2008/0066039 A1 * | 3/2008 | Berry et al. | 716/10 |
| 2008/0148208 A1 * | 6/2008 | Jacobsen et al. | 716/8 |
| 2009/0039508 A1 * | 2/2009 | Kaufmann | 257/738 |
| 2009/0210848 A1 * | 8/2009 | Cox | 716/12 |
| 2010/0013506 A1 * | 1/2010 | Kim et al. | 324/754 |
| 2011/0115512 A1 * | 5/2011 | Miller | 324/754.03 |
| 2011/0121851 A1 * | 5/2011 | Lee et al. | 324/756.03 |

FOREIGN PATENT DOCUMENTS

KR       2004007149 A  *  1/2004

* cited by examiner

*Primary Examiner* — Phallaka Kik
(74) *Attorney, Agent, or Firm* — Womble Carlyle Sandridge & Rice, LLP (57) ABSTRACT

An access pad is used to provide access to a functional block of an integrated circuit (IC) device. The access pad is formed using dummy metal in an open space in a metallization level that is between a top metallization level and a base level on which the functional block is formed in the IC device. The access pad at the metallization level provides a contact to access an underlying circuit of the functional block so that the functional integrity of the functional block of the IC device can be verified during probing.

18 Claims, 8 Drawing Sheets

INTEGRATION OF OPEN SPACE/DUMMY METAL AT CAD FOR PHYSICAL DEBUG OF NEW SILICON

BACKGROUND OF THE INVENTION

Over the past generation, integrated circuits have grown in complexity to accommodate the ever demanding thirst for higher power and greater performance. With the increasing complexity of integrated circuits (ICs), there has been a tremendous push to improve reliability of the finished product. Great progress has been made in all phases of fabrication to provide reliable finished products. Reliability of integrated circuits is of paramount importance as it affects the overall quality of the finished product and, ultimately, the return on investment.

Failure analysis has become a critical requirement during a new product design. Failure analysis includes applying a selected voltage through a circuit input and observing the circuit output voltage by using probes. The probes are connected to the contacts of the underlying circuits and the input and output voltages at the circuits are measured through the probes. Due to the sheer volume of contacts and due to space limitations at the surface of the IC device, the number of probes that may be practically connected to the contacts is limited thereby reducing the number of circuits that may be probed. Additionally, the package configuration, such as a flip chip package, of the IC device makes applying these probes and examining the input and output voltages through these probes extremely difficult.

Further, conventional probes provide contact level characterization rather than cell level characterization. As a result, when a failure occurs during a test, the traditional probe identifies the location of the failure at a transistor level. In order to determine which of the underlying circuits caused a failure, the IC device has to be planarized to the transistor level and each transistor tested for integrity. As the number of transistors can be extremely large, this type of failure analysis testing is both time consuming and costly.

It would be advantageous to have a scheme that will provide a cell level characterization rather than contact level characterization of the IC device. It would also be advantageous if the scheme works for all types of package configuration. It would also be advantageous to have a scheme that addresses the spatial limitation at the surface of the IC device for placing the probe so that the number of circuits that can be tested is not limited by the spatial limitation at the top surface of the IC device.

BRIEF SUMMARY OF THE INVENTION

Broadly speaking, the present invention fills these needs by providing a method of using open space available at various metallization levels of the IC device for placing access pads. The access pads located at the various metallization levels use dummy metals available at the open spaces. These access pads are electrically connected to the underlying circuit and are used as probes to verify the integrity of the IC device circuitry.

One embodiment includes a method for providing IC device (chip) probing. Critical circuits and critical nodes associated with the critical circuits of the IC device are identified from the actual design of the IC device using Computer Aided Design (CAD) tool, netlist and interconnectivity information. The critical circuits and critical nodes in the critical circuits form a functional block. The functional block provides a particular function, such as memory management, etc. An open space is identified at a metallization level between the top metallization level and a base level where the functional block of the IC device is located. The metallization level within the IC device is selected such that it includes less dense features and more open space than the underlying levels so that placing of an access pad is feasible. An access pad is created in the identified open space. The access pad is electrically connected to the underlying functional block of the IC device to enable verification of the integrity of the critical nodes in the functional block of the IC device.

During testing, when a functional block of the IC device fails, an appropriate access pad that connects to the functional block with failure is identified. The access pad provides a contact to the underlying circuit of the functional block and is used in probing the plurality of critical nodes of the functional block from a higher metallization level to identify the location, analyze and debug the failure at the functional block of the IC device.

Other aspects and advantages of the invention will become more apparent from the following detailed description, taken in conjunction with the accompanying drawings, illustrating by way of example the present invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

The present invention provides a probing scheme for analyzing and debugging an integrated circuit (IC) device. According to this scheme, a functional block is identified within the IC device. The functional block includes a plurality of circuits and a plurality of critical nodes that make up each of the plurality of circuits. The circuits and critical nodes of the functional block are identified from the design of the IC device using a Computer Aided Design (CAD) tool, netlist and interconnectivity information. An appropriate metallization level with one or more open spaces is identified between a top metallization level and a level where the identified functional block of the IC device is located. The level where the identified functional block of the IC device is located is considered as the base level. The appropriate metallization level is identified such that it includes less dense features and more open spaces than the underlying metallization levels so that placing of an access pad at one or more of the open spaces to connect to the underlying circuitry is feasible. An open space in the appropriate metallization level is identified and an access pad is formed at the identified open space using the available dummy metal. The access pad is connected to the functional block at the base level through a contact. The access pad provides higher level access to the underlying circuit of the IC device for analysis and debugging.

The advantages of using this probing scheme are numerous. By using the unused open spaces in the various metallization levels between the top metallization level and the base of the IC device for forming access pads to probe the underlying circuit of a functional block, optimal use of available space in the IC device is achieved in a cost effective manner. As the functional blocks may be accessed from the available open spaces within the IC device, access to the critical nodes is not limited by the peripheral or surface dimensions of the IC device die. As more and more features and functional blocks are added to the IC device, access to the newly formed features and functional blocks within the IC device may be accomplished without having to sacrifice access to other functional blocks due to spatial constraint. The current probing scheme enables functional block (cell) level characterization. The cell level characterization is helpful in efficiently isolating and debugging failures and for performing analysis. Additionally, this scheme provides access to underlying circuit for all types of package configuration, such as front and back side access, for probing.

Figure 1A:
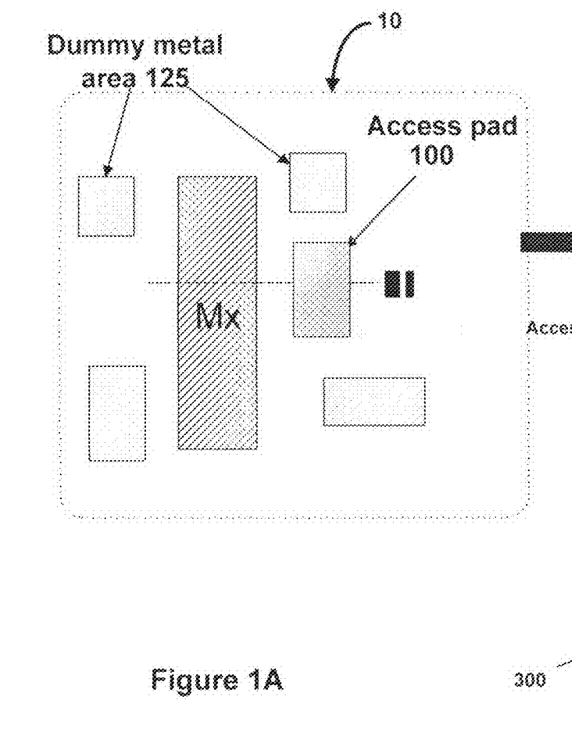
FIG. 1A depicts a top view of a metallization level with a plurality of open spaces and an access pad, in one embodiment of the present invention.

FIG. 1A illustrates a top view of a metallization level of a silicon substrate 10. The metallization level is located in between a top metallization layer and a base layer on which a circuitry of a functional block to be probed is located. The metallization layer includes a plurality of dummy metal areas 125 and an access pad 100, in one embodiment of the invention. The dummy metal areas 125 are open unused spaces having dummy metal fillings and are formed during fabrication of the IC device.

As part of designing the IC device, a plurality of fabrication operations are used to form various features on a silicon substrate in accordance with an approved design model for the IC device. In one such fabrication, a dummy metal, such as copper, is used in a planarization operation, such as chemical mechanical polishing (CMP), to enhance planarizing of the silicon substrate so that additional features may be formed. In order to provide a substantially planarized substrate surface, the dummy metal fills some of the open spaces thereby forming dummy metal areas 125. As additional features are added vertically on the silicon substrate, some of these dummy metal areas 125 at various metallization levels are left unused. An unused dummy metal area (open space) 125 at the appropriate metallization level, that is between the top metallization level and the base level, is identified during fabrication using the Computer Aided Design tool along with netlist and interconnect information. An access pad is created in the identified open space 125 using the available dummy metal, as illustrated in FIG. 1A. The identification of unused open space 125 in the appropriate metallization level and creation of the access pad is based on location and nature of the underlying critical nodes to be monitored or probed.

Figure 1B:
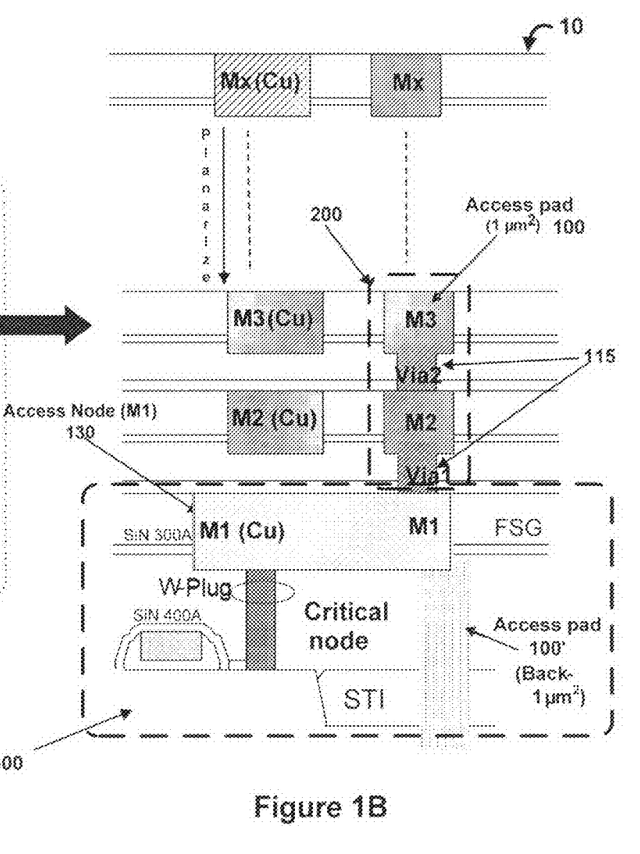
FIG. 1B illustrates a side cross-sectional view of an IC device having a plurality of metallization levels and a critical node of a functional block, in one embodiment of the present invention.

FIG. 1B illustrates a schematic cross-sectional view of an integrated circuit device formed on a silicon substrate 10 having a plurality of metallization levels M1, M2, M3, ... Mx. The IC device includes a plurality of functional blocks 300 with each of the functional blocks 300 having a plurality of critical circuits and with each critical circuit having a plurality of critical nodes. A functional block 300, as used in this application, is defined as one or more electronic circuits with a plurality of nodes arranged into blocks associated with a particular function, such as memory blocks, digital signal processing, etc. A node, as used in this application, is defined as any point on the electrical circuit of the IC device. For instance, a node may be an input or output terminal of a logic gate within an electronic circuit.

In order to provide access to the functional blocks 300 from a higher metallization level, critical circuits of the IC device that need monitoring are first identified. The critical circuits include a plurality of critical nodes. In one embodiment, the critical circuit and critical nodes are identified based on gross physical failures that may occur on these nodes rendering the IC device inoperable. In one embodiment, a CAD tool in conjunction with netlist and interconnection information from an actual design of the IC device may be used in identifying these critical circuits and critical nodes. The critical circuits and the critical nodes are part of a functional block.

As part of design and fabrication of the IC device, a plurality of fabrication operations are used in forming various features, such as electronic circuitry with one or more nodes. Additional metallization layers are formed vertically over the circuitry and features formed over the metallization layers are connected to the underlying circuitry through metal interconnects. One or more critical circuits of the underlying circuitry are identified along with critical nodes in each of the critical circuits based on gross physical failures that may occur on these nodes. Following the identification of the critical nodes, one or more unused open spaces with dummy metals (dummy metal areas 125) are identified at an appropriate metallization level between the top metallization level Mx and a base level M1 where the identified critical nodes in the underlying circuitry of the functional block 300 is present. The appropriate metallization level is chosen such that there are less dense features and more unused open spaces than the underlying metallization levels so that providing an access pad to access dense features of the functional block is feasible. In one embodiment, a CAD tool may be used in identifying the unused open spaces at the appropriate metallization level. An appropriate open space is then chosen from the plurality of open spaces at the metallization level such that the critical nodes of the critical circuit are easily accessed from the chosen open space. An access pad 100 is created at the chosen open space using the dummy metal available at the open space. The access pad is created during the fabrication of the IC device. The access pad is electrically connected to the underlying circuit through a critical path 200 that includes vias 115 that traverse through multiple levels of the IC device.

As illustrated in FIG. 1B, a critical circuit to be monitored is identified as being located in functional block 300. The identified critical circuit at the functional block 300 is accessed through an access node 130 at metallization level M1. An unused open space near the underlying critical circuit of the functional block 300 is identified at a metallization level M3 between a top metallization level Mx and a base level M1. An access pad 100 is formed at the identified open space using dummy metal available at the open space. The access pad 100 is then electrically connected to the underlying circuit of the functional block 300 through access node 130 in metallization level M1 and critical path 200. The critical path 200 includes vias 115 that traverse multi-levels (M3 and M2) of the IC device.

Once the access pads 100 have been built at various metallization levels and connected to the appropriate functional blocks of the IC device, the access pads 100 can be used in analyzing the IC device circuit. During actual testing of a physical design, when a failure is encountered at a particular functional block 300, a portion of the IC device encompassing the functional block 300 that has the failure is planarized down to the metallization level at which an access pad 100 is available. For instance, as illustrated in FIG. 1B, during failure analysis, a portion of the IC device containing the functional block 300 having a failure is planarized from metallization layer Mx (where x is an integer greater than 3) down to metallization level M3 where an access pad connecting to the functional block 300 is available. An electrical signal is sent through the access pad 100 and critical path 200 to the functional block 300 to verify the integrity of the functional block and to identify the location of the failure.

It should be noted that although the current embodiment was described for accessing the critical nodes at the functional block 300 from the top (front side), the embodiment could be extended to provide back side access to the functional block 300 through an access pad 100' extending from the underside of the IC device as illustrated in FIG. 1B.

Figure 2A:
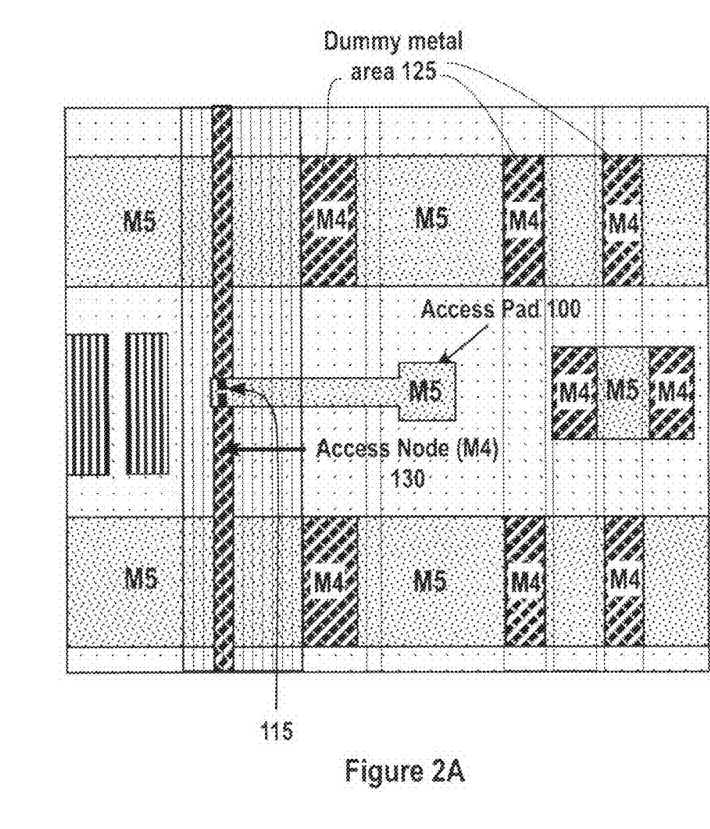
FIG. 2A illustrates a top view of a front side access to a critical node of a functional block for a wire bond package, in one embodiment of the invention.

FIG. 2A depicts a top-view of a metallization layer on which an access pad 100 is formed to access a functional block 300 from the front side, in one embodiment of the invention. In this embodiment, the packaging configuration used is a wire bond package. A plurality of open spaces with dummy metal, dummy metal areas 125, is identified at metallization level M5 to access underlying circuit of a functional block 300 at metallization level M4. An access pad 100 is formed in the metallization level M5 at an open space that is near the underlying circuit and vias 115 are formed between the metallization level M4 and M5 to enable the access pad 100 to access the circuitry for the functional block 300 from access node 130 at metallization level M4. Once the access pad 100 is formed, the access pad 100 is used in sending electrical signals to the functional block through the underlying circuit located in metallization level M4 to identify the location of the failure.

During a reliability testing of an IC device, when a failure is encountered, a portion of the IC device that includes a portion of the functional block 300 with a failure is planarized to a metallization level where an access pad 100 to the functional block 300 is located. This may include planarizing both metallization levels and metal passivation levels that may have been formed on top of the metallization levels to preserve the functionality of the metal features formed therein. In order to ensure that the planarizing of the IC device down to the metallization level is precise and does not damage the underlying circuit, features, access pad or the metallization level on which the access pad is located, the exact location of the access pad is determined and used during planarizing. In one embodiment, the planarizing to an access pad is done by a Focused Ion Beam (FIB) tool using the location coordinates (x and y coordinates) of the access pad 100 to expose a contact of the access pad. The FIB tool uses an ion beam of atoms, such as Gallium, to provide a more focused planarizing. The exposed contact at the access pad is used to send to and receive electrical signals from the underlying functional block 300 to determine the cause of the failure.

Figure 2B:
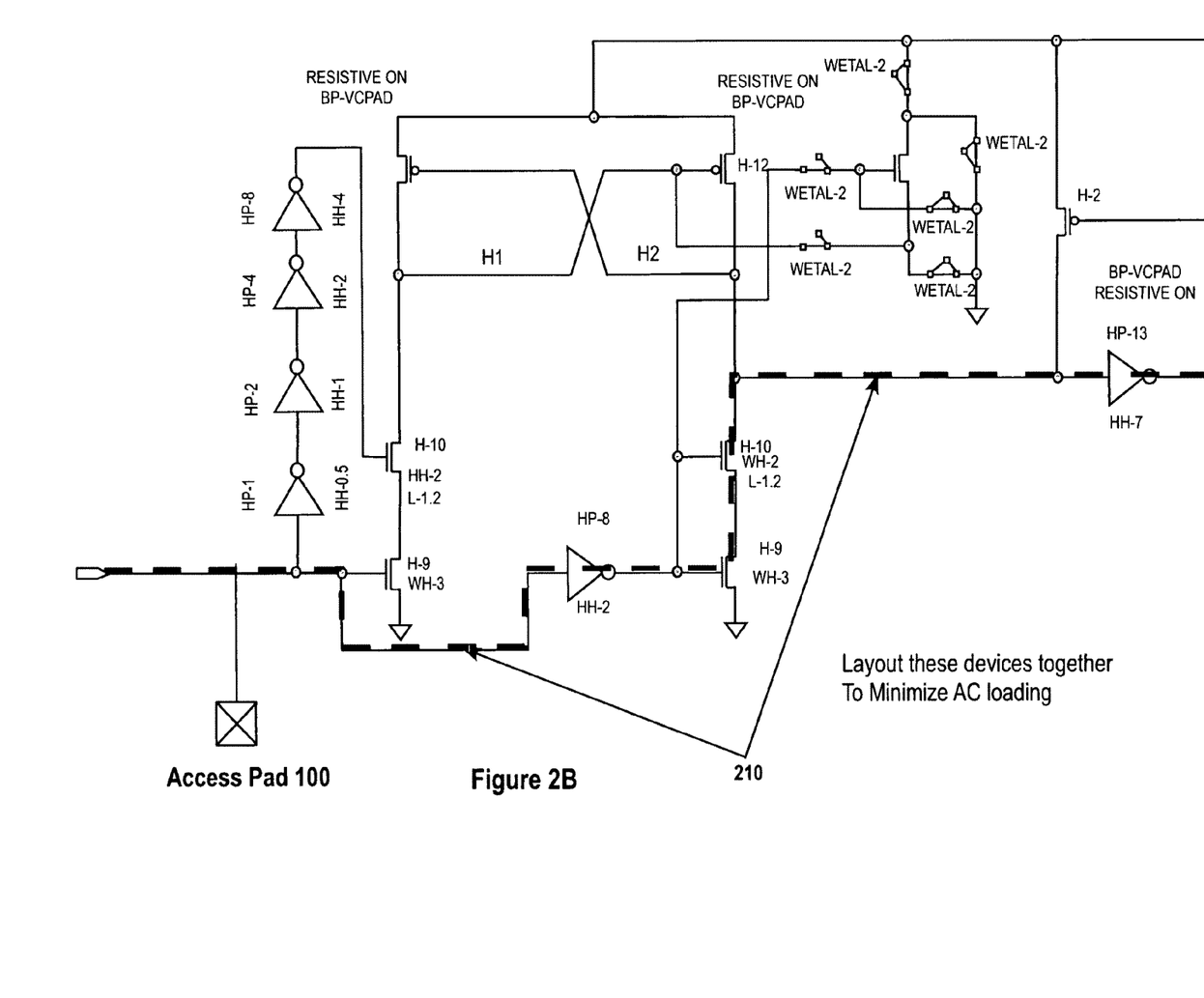
FIG. 2B illustrates a schematic diagram of a critical signal path between an access pad and a critical node using front side access, in accordance with one embodiment of the present invention.

FIG. 2B illustrates a schematic diagram of a critical signal path 210 followed by an electrical signal between an access pad 100 and a critical node in the critical circuit using front side access, in one embodiment of the invention. As shown, an electrical signal initiated at the access pad 100 travels through the various metallization levels and through vias 115 of critical path 210 to the underlying circuit of the functional block 300. In response to the electrical signal from the access pad 100, a return signal is sent from the underlying circuit back to the access pad 100. By analyzing a waveform of the signal, from each of a plurality of critical nodes in the functional block, the location of the failure can be identified and cause of failure determined.

Figure 3A:
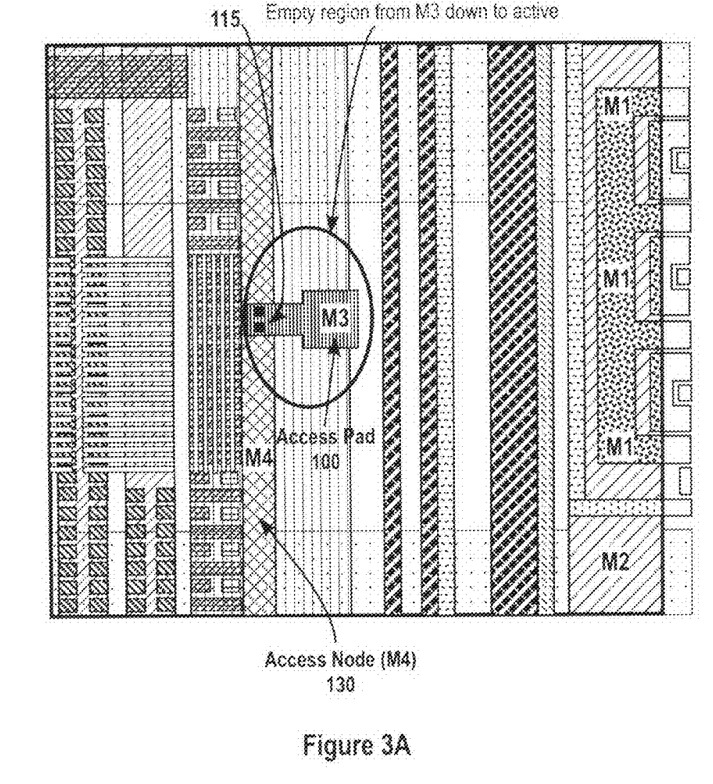
FIG. 3A illustrates a top view of a back side access to a critical node of a functional block for a flip chip package, in one embodiment of the present invention.

FIG. 3A illustrates a top-view of a metallization layer on which an access pad 100 is formed to access a functional block from the back side, in one embodiment of the invention. In this embodiment, the packaging configuration used is a flip chip package. A flip chip package is a packaging configuration wherein the active area of the IC device is "flipped over" facing downward. As a result, the entire surface of the flip chip die is used for establishing interconnects. The flip chip packaging allows for large number of interconnects with shorter signal paths while reducing the interconnect inductance and capacitance, which consequently improves electrical performance. Due to the elimination of wire bond interconnect, flip chip packaging results in a reduced package size.

Referring back to FIG. 3A, an access pad formed in an unused open space with dummy metal is identified at metallization level M3 to access an overlying circuit of a functional block at metallization level M4. The metallization level M3 is accessed through the back side of the IC device by drilling an access hole in the back side of the IC device. The access hole may be drilled using a precision drilling tool such as a Focused Ion Beam (FIB) tool so that underlying and overlying features are not damaged. Once the access hole is drilled, an access pad 100 embedded in the metallization level M3 is found along with vias 115 formed between the metallization level M4 and M3 to allow the access pad 100 to access the circuit for the functional block 300 from the back side. The access pad 100 includes a contact through which electrical signals are sent to and received from the critical circuits of the functional block 300 located in metallization level M4 to pinpoint the location and analyze the cause of the failure.

Figure 3B:
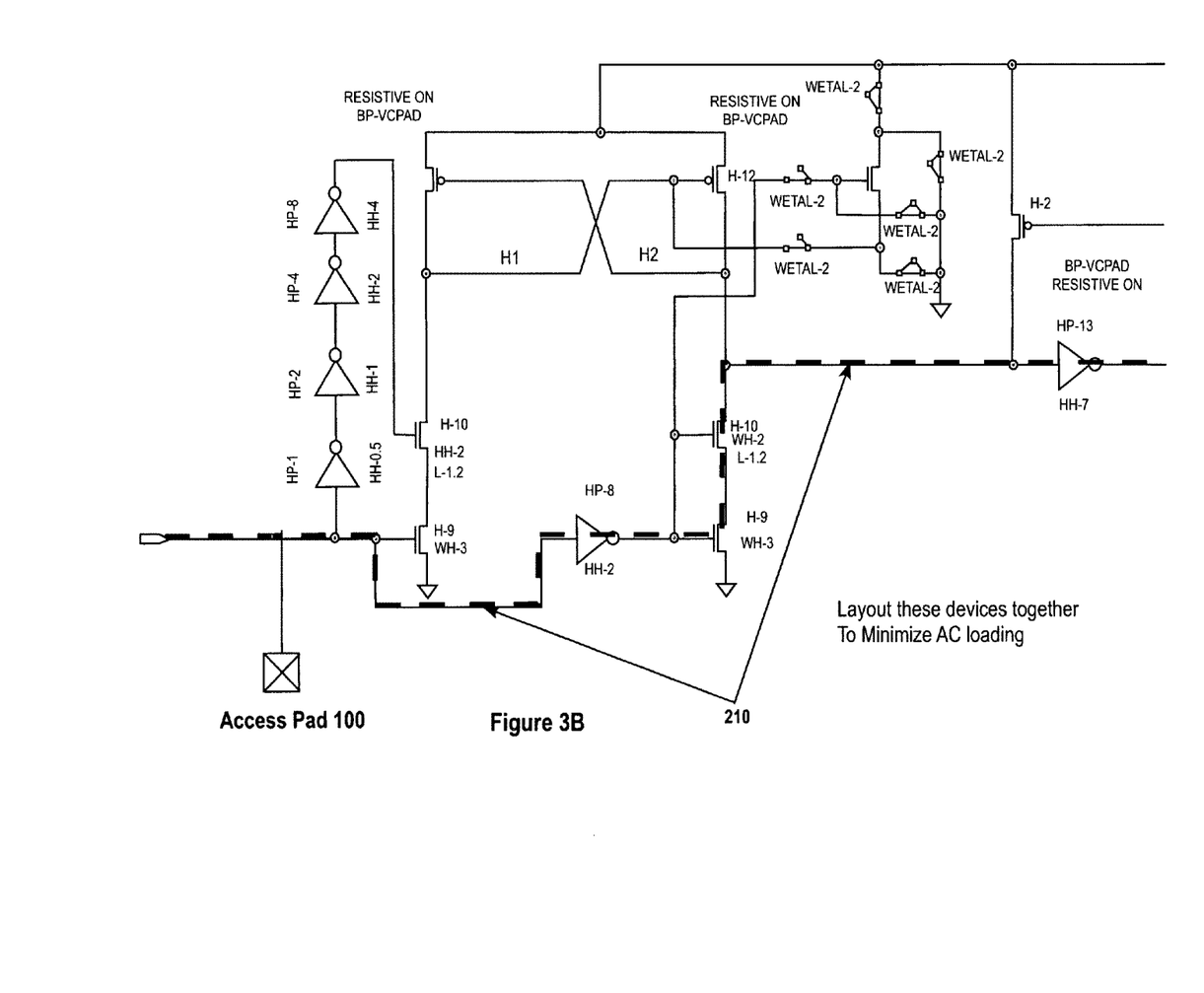
FIG. 3B illustrates a schematic diagram of a critical signal path between an access pad and a critical node using back side access, in accordance with one embodiment of the present invention.

FIG. 3B illustrates a schematic diagram of a critical signal path 210 followed by an electrical signal between an access pad and a critical node in the critical circuit using back side access, in one embodiment of the invention. As shown, an electrical signal initiated at the access pad travels through the various metallization levels and through the vias 115 in critical path 210 to the critical circuit of the functional block 300. In response to the electrical signal from the access pad 100, a return signal is sent from the underlying circuit back to the access pad 100. By analyzing a waveform of the electrical signal, from each of a plurality of critical nodes in the functional block, the location of the failure can be identified and the cause of failure determined.

Figure 4:
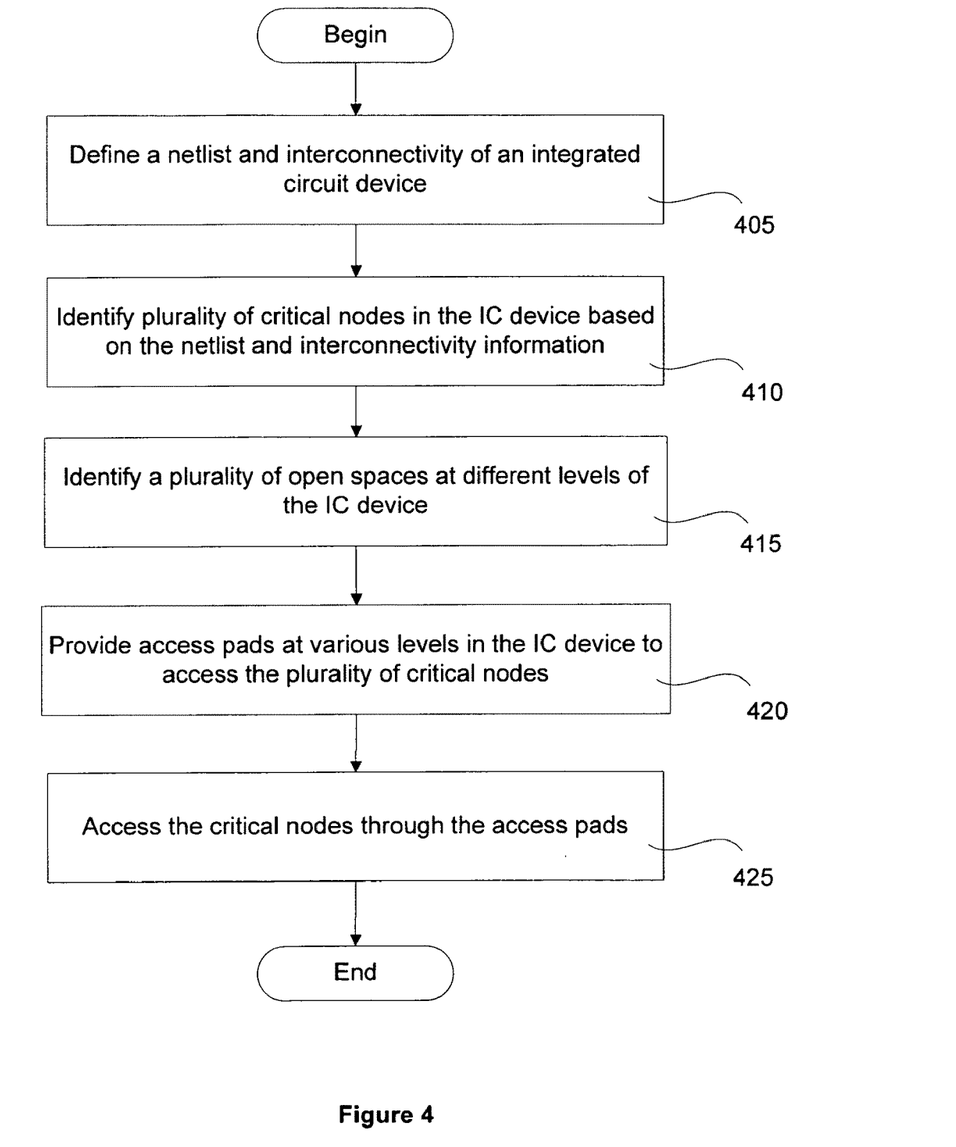
FIG. 4 illustrates a flow chart of operations involved in providing access to a critical node from a higher metallization level through an access pad, in accordance with one embodiment of the present invention.

With the above general understanding of the present invention, a method to provide an on chip probe for an integrated circuit device will now be described with reference to FIG. 4. During the design phase of an integrated circuit (IC) device netlist and interconnectivity information are defined for the given IC device design, as illustrated in operation 405. Upon finalizing the design of the IC device, a plurality of critical circuits and critical nodes within the critical circuits are identified, as illustrated in operation 410. The critical circuits and critical nodes may be identified using a CAD tool, generated netlist and interconnectivity information. In one embodiment, a test is run on the IC device and the critical circuits and critical nodes are identified using CAD tool, netlist and interconnectivity information based on the test run.

In operation 415, an unused open space is identified at an appropriate metallization level that lies between a top metallization level and a base level, where a functional block to be probed is located. The appropriate metallization level where the access pad is to be located is carefully chosen by analyzing the design using the CAD tool, netlist and interconnectivity information such that placement of an access pad will not damage the features that are already formed. The unused open space is chosen such that the open space is near the identified critical nodes of the critical circuit so that the critical nodes can be easily accessed.

In operation 420, an access pad is created at the identified open space in the appropriate metallization level of the IC device. The access pad is formed at the open space of the metallization level such that the overall functionality of the IC device is not compromised. In operation 425, access to the underlying critical circuit of the functional block is provided through the access pad. A critical path to access the underlying critical circuit from the access pad is provided by forming one or more vias from the metallization level where the access pad is embedded to the base level where the critical circuit of the functional block is located. The access is enabled by electrically connecting the access pad to the underlying circuit of the functional block through the vias. The vias may spawn multi-levels. The access pad is used in accessing the critical nodes of the IC device from a higher metallization level during failure analysis. Thus, the embodiments of the present invention provide a functional block level characterization of a failure from a higher metallization level and then allow probing at a functional block level to identify a critical node that causes the failure.

Figure 5:
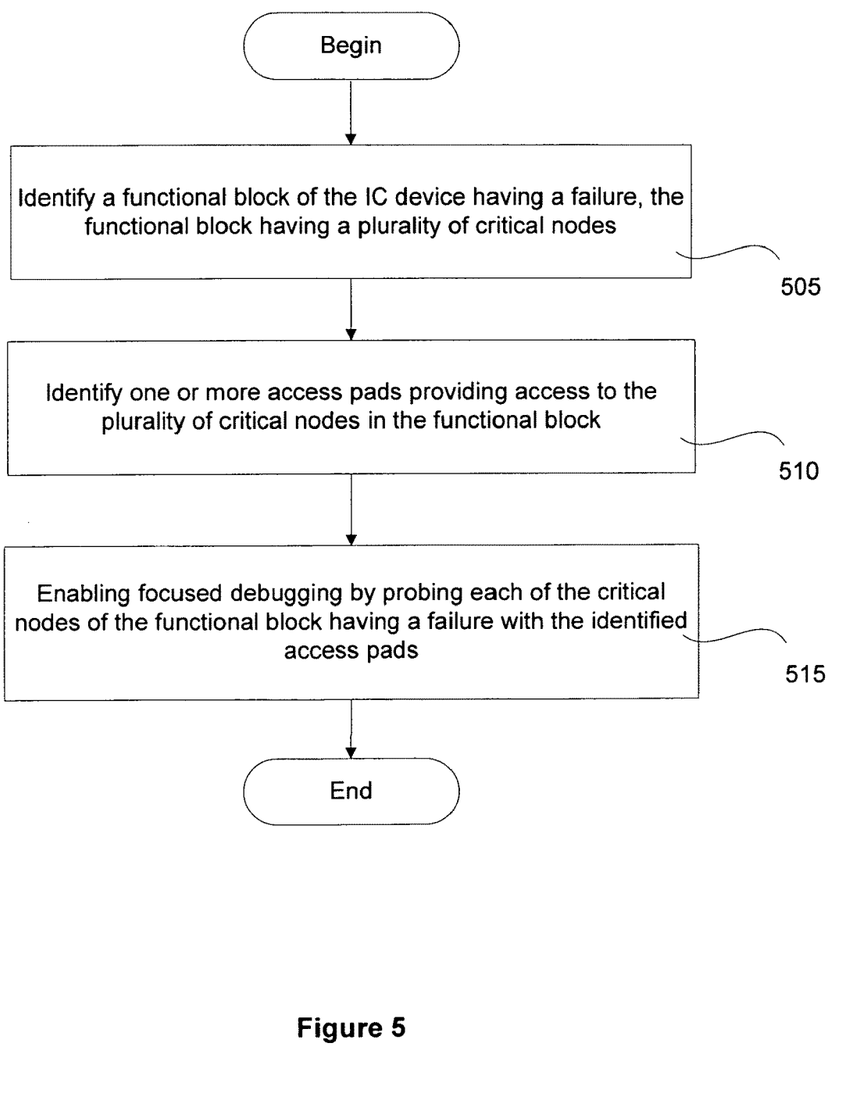
FIG. 5 illustrates a flow chart of operations involved in providing physical debugging of a functional block from a higher metallization level, in accordance with one embodiment of the present invention.

FIG. 5 illustrates a flow chart of operations involved in providing a physical debugging tool for an IC device, in an embodiment of the invention. During a test run, a functional block of the IC device may encounter failure, such as an I/O failure due to delay in timing signal. In order to analyze the cause of the failure, one or more access pads available at the IC device are used to obtain cell level characterization of failure.

In operation 505, a functional block of the IC device having a failure is identified. The identification of the functional block with a failure is done during the testing phase of the IC device. The functional block may include one or more critical circuits with a plurality of critical nodes. The functional block is located at a base level of the IC device. The IC device includes a plurality of metallization levels and a plurality of access pads that connect to the underlying circuits of one or more functional blocks. The access pads were formed during a design phase of the IC device at various metallization levels between a top metallization level and a base level where the functional block is located and connected through critical paths to the underlying critical circuits.

In operation 510, an appropriate access pad with a critical path to the functional block is identified. The appropriate access pad is identified based on the packaging configuration used to package the IC device so that the functional block having an identified failure may be easily accessed.

In operation 515, the identified access pad at the desired metallization level is used in probing the plurality of critical nodes of the IC device to identify the location and cause for failure. The access pad at the metallization level is accessed by planarizing a portion of the IC device having the functional block with a failure to the metallization level where the access pad is located. This is accomplished by obtaining coordinates of the precise location of the identified access pad and using a planarizing tool, such as FIB tool, to planarize the portion of the IC device to the metallization level of the access pad based on the coordinates so that a contact at the access pad is exposed without damaging adjacent features. This scheme enables accessing the functional block irrespective of the type of package configuration of the IC device. An electrical signal may be transmitted through the contact of the access pad to the underlying functional block to locate and analyze the failure.

In order to debug a failure or analyze a critical circuit, electrical signals are sent to and received from the various critical nodes in each critical circuit. Waveforms for each critical circuits of a functional block are generated from these electrical signals. The generated waveforms for the critical circuits of each functional block are then compared against a waveform from a control functional block to determine any abnormalities in the waveform. The abnormalities of each waveform may then be interpreted to determine the cause of a failure.

It should be noted that the functional blocks with a plurality of critical circuits discussed in the various embodiments throughout the application are typically located in the outer Input-Output (IO) ring of an IC device. The multiple functional blocks in the IO ring may be segmented based on location of a failure and some of the segmented functional blocks may be eliminated from analysis or testing thereby reducing the time needed for testing and failure analysis. Thus, the probing scheme of the present invention allows for a more focused failure analysis. The present invention may be successfully used for cell level characterization, power consumption studies, fault analysis, power-on-reset/phase-lock-loop/fuse characterizations and for design verification/debugging.

The embodiments, described herein may be employed with any integrated circuit, such as processors and programmable logic devices (PLDs). Exemplary PLDs include but are not limited to a programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be the STRATIX® II GX devices owned by the assignee.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for providing an on-chip probe for an integrated circuit (IC) design, the method comprising:
   identifying a functional block in the IC design, the functional block including a plurality of circuits having a plurality of nodes;
   identifying an open space at a metallization level between a top metallization level and a base level at which the functional block is located in the IC design;
   embedding an access pad within the identified open space of the metallization level to access the functional block in the IC design, wherein access to the access pad is unavailable from external surfaces of an IC represented by the IC design; and
   providing access to the functional block in the IC design from the access pad, wherein at least one operation is performed by a processor.

2. The method as recited in claim 1, wherein the functional block and the open space are identified using a netlist and interconnectivity information of the IC design.

3. The method as recited in claim 1, wherein the functional block and the open space are identified using a Computer Aided Design (CAD) tool.

4. The method as recited in claim 1, wherein the identifying the open space further comprises:
   identifying a plurality of open spaces within the metallization level; and
   selecting an open space from the plurality of open spaces available at the identified metallization level such that the selected open space is a closest open space to the plurality of circuits of the functional block.

5. The method as recited in claim 1, wherein the embedding further comprises:
   inserting the access pad in the identified open space of the metallization level, wherein placement of the access pad retains functionality of the IC design.

6. The method as recited in claim 1, wherein the providing further comprises:
   creating a path with vias to one of the plurality of circuits of the functional block from the access pad of the metallization level; and
   establishing an electrical connection from the access pad to the one of the plurality of circuits through the vias.

7. The method as recited in claim 1, wherein the providing is based on a packaging configuration of the IC design.

8. The method as recited in claim 1, further comprising:
   fabricating the IC from the IC design;
   removing layers of the fabricated IC to expose the access pad; and
   accessing the functional block through the exposed access pad.

9. The method as recited in claim 8, wherein the removing is based on coordinates of the metallization level in which the access pad is located.

10. The method as recited in claim 8, wherein the removing is destructive to the IC and functionality performed by the IC.

11. The method as recited in claim 8, wherein the removing comprises:
    drilling an access hole through a back side of the fabricated IC to the identified metallization level where the access pad is embedded; and
    accessing the functional block through the access pad.

12. The method of claim 1, wherein the functional block is located in the Input-Output (IO) ring of the IC design.

13. A method for debugging an integrated circuit (IC) device, the method comprising:
    identifying a functional block of the IC device having a failure, the functional block including a plurality of circuits with a plurality of nodes in each of the plurality of circuits;
    identifying an access pad electrically coupled to the functional block to be probed, the access pad located at a metallization level different from a level at which the functional block is located, wherein access to the identified access pad is unavailable from external surfaces of the IC device;
    removing layers of the IC device to expose a surface of the identified access pad; and
    probing the functional block through the exposed surface of the identified access pad to locate and analyze failures at the functional block.

14. The method of claim 13, wherein the identifying the functional block further comprises:
    querying netlist and interconnectivity information defining a design of the IC device to identify an open space at the metallization level where the access pad is provided.

15. The method of claim 14, wherein when a package configuration of the IC device is a flip chip configuration, the removing initiates from a bottom surface of the IC device.

16. The method of claim 13, wherein the removing further comprises:
    planarizing the IC device to the metallization level based on identified coordinates of the identified access pad.

17. The method of claim 16, wherein the planarization is destructive to the IC device.

18. The method of claim 13, wherein the removing further comprises:
    drilling an access hole through a back side of the IC device to the identified metallization level where the access pad is provided; and
    accessing the functional block through the access pad.

* * * * *